United States Patent
Mitsumori et al.

(10) Patent No.: US 8,967,608 B2
(45) Date of Patent: Mar. 3, 2015

(54) GLASS SUBSTRATE-HOLDING TOOL AND METHOD FOR PRODUCING AN EUV MASK BLANK BY EMPLOYING THE SAME

(75) Inventors: Takahiro Mitsumori, Tokyo (JP); Takeru Kinoshita, Tokyo (JP); Hirotoshi Ise, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 609 days.

(21) Appl. No.: 13/347,150

(22) Filed: Jan. 10, 2012

(65) Prior Publication Data

US 2012/0183683 A1    Jul. 19, 2012

(30) Foreign Application Priority Data

Jan. 18, 2011    (JP) .................................. 2011-007760

(51) Int. Cl.
| | | |
|---|---|---|
| H01L 21/687 | (2006.01) | |
| C23C 14/50 | (2006.01) | |
| G03F 1/24 | (2012.01) | |
| H01L 21/677 | (2006.01) | |
| H01L 21/683 | (2006.01) | |

(52) U.S. Cl.
CPC . *C23C 14/50* (2013.01); *G03F 1/24* (2013.01); *H01L 21/67748* (2013.01); *H01L 21/6831* (2013.01); *H01L 21/68728* (2013.01); *Y10S 269/903* (2013.01); *Y10S 269/90* (2013.01)
USPC ........... 269/289 R; 269/903; 269/900; 269/21

(58) Field of Classification Search
USPC ................................ 269/903, 21, 900, 289 R
See application file for complete search history.

(56) References Cited

U.S. PATENT DOCUMENTS

| | | | | |
|---|---|---|---|---|
| 4,412,133 A | * | 10/1983 | Eckes et al. ................. | 250/492.2 |
| 4,480,284 A | * | 10/1984 | Tojo et al. ...................... | 361/234 |
| 5,103,367 A | * | 4/1992 | Horwitz et al. ............... | 361/234 |
| 5,166,856 A | * | 11/1992 | Liporace et al. .............. | 361/233 |
| 5,474,614 A | * | 12/1995 | Robbins ........................ | 118/728 |
| 5,535,507 A | * | 7/1996 | Barnes et al. .................... | 29/825 |
| 5,673,167 A | * | 9/1997 | Davenport et al. ........... | 361/234 |
| 6,951,502 B2 | | 10/2005 | Koike et al. | |
| 2003/0003749 A1 | * | 1/2003 | Sexton et al. ................. | 438/694 |
| 2005/0238922 A1 | | 10/2005 | Kinoshita et al. | |
| 2011/0292561 A1 | * | 12/2011 | Kamimura et al. ........... | 361/234 |
| 2012/0100464 A1 | * | 4/2012 | Kageyama ........................ | 430/5 |

FOREIGN PATENT DOCUMENTS

| | | |
|---|---|---|
| JP | 2005-77845 | 3/2005 |
| JP | 2005-210093 | 8/2005 |

(Continued)

OTHER PUBLICATIONS

U.S. Appl. No. 13/475,459, filed May 18, 2012, Mitsumori, et al.

*Primary Examiner* — Lee D Wilson
*Assistant Examiner* — Tyrone V Hall, Jr.
(74) *Attorney, Agent, or Firm* — Oblon, McClelland, Maier & Neustadt, L.L.P.

(57) ABSTRACT

A glass substrate-holding tool employed during the production of a reflective mask blank for EUV lithography includes an electrostatic chuck and a mechanical chuck. A caught and held portion of a glass substrate caught and held by the electrostatic chuck, and pressed portions of the glass substrate pressed by the mechanical chuck are located outside a quality-guaranteed region on each of a film deposition surface and a rear surface of the glass substrate. The sum of a catching and holding force applied to the glass substrate by the electrostatic chuck and a holding force applied to the glass substrate by the mechanical chuck is at least 200 kgf. A pressing force per unit area applied to the glass substrate by the mechanical chuck is at most 25 kgf/mm$^2$.

7 Claims, 3 Drawing Sheets

(56) References Cited

FOREIGN PATENT DOCUMENTS

| JP | 2005-301304 | 10/2005 |
| JP | 2006-49910 | 2/2006 |
| JP | 2009-176776 A | 8/2009 |
| JP | 2009-186662 | 8/2009 |
| JP | 2009-267113 | 11/2009 |
| WO | WO 2008/007521 A1 | 1/2008 |

* cited by examiner

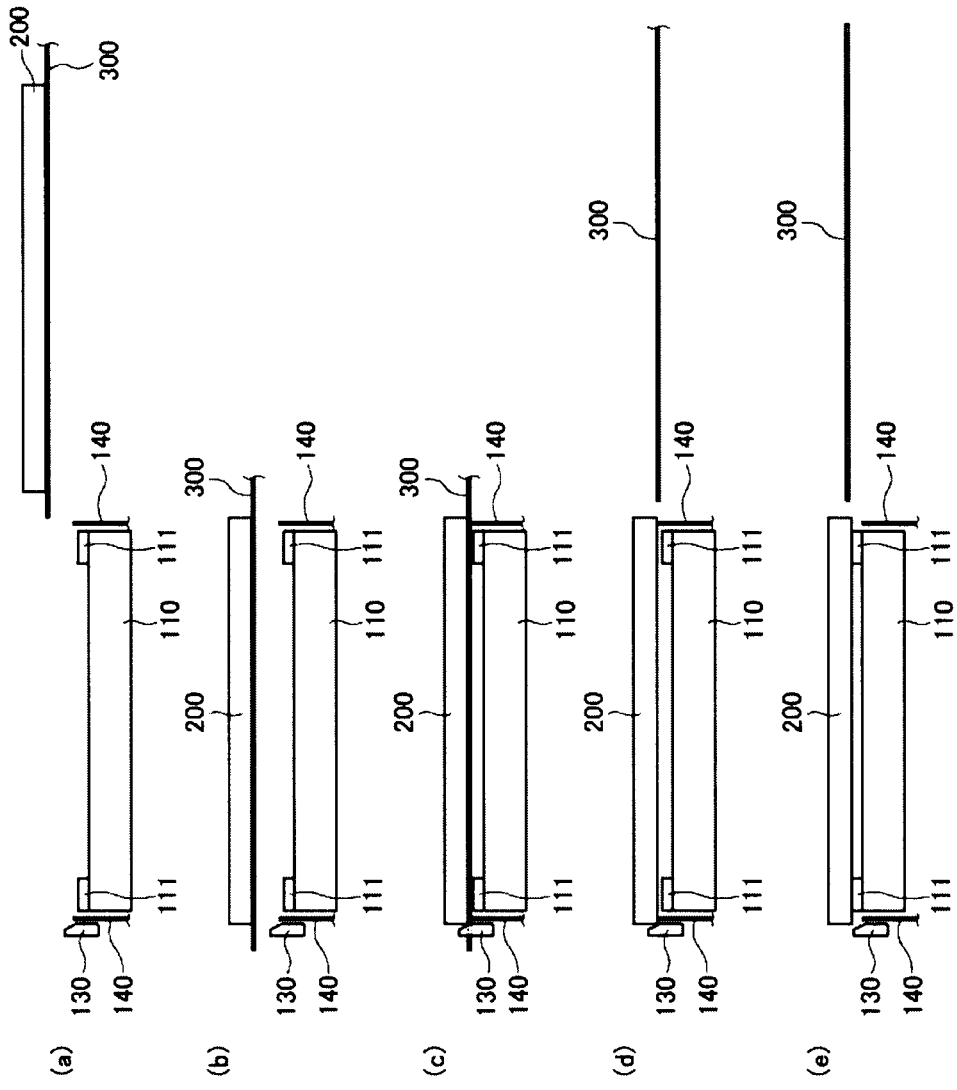

GLASS SUBSTRATE-HOLDING TOOL AND METHOD FOR PRODUCING AN EUV MASK BLANK BY EMPLOYING THE SAME

BACKGROUND OF INVENTION

1. Field of Invention

The present invention relates to a glass substrate-holding tool. The glass substrate-holding tool according to the present invention is useful for holding a glass substrate during the production of a reflective mask blank for EUV (Extreme Ultra Violet) lithography (hereinbelow, referred to as "EUV mask blank" in the specification) to be used for, e.g. the production of semiconductors, and during the production of a functional film-provided substrate for such an EUV mask blank.

Further, the present invention relates to a method for producing an EUV mask blank and a functional film-provided substrate for such an EUV mask blank by employing the glass substrate-holding tool according to the present invention.

2. Discussion of Background

In the semiconductor industry, a photolithography method using visible light or ultraviolet light has been employed as a technique for transferring a fine pattern on a silicon substrate or the like, which is required for forming an integrated circuit including such a fine pattern. However, the conventional photolithography method has reached near to the limit while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In this specification, it should be noted that the phrase "EUV light" means a ray having a wavelength in a soft X ray region or a vacuum ultraviolet ray region, specifically a ray having a wavelength of about 10 to 20 nm, in particular of about 13.5 nm±0.3 nm.

It is impossible to employ a conventional dioptric system like photolithography using visible light or ultraviolet light since EUV light is apt to be absorbed by any substances and since the refractive index of the substances is close to 1 at this wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. As the reflective layer, a Mo/Si multilayer reflective film is usually employed wherein molybdenum (Mo) layers as high refractive layers and silicon (Si) layers as low refractive layers are alternately stacked to increase a light reflectance when irradiating a layer surface with EUV light.

As the absorber layer, a material having a high absorption coefficient to EUV light, specifically, e.g. a material containing chromium (Cr) or tantalum (Ta) as the main component, is employed.

The multilayer reflective film and the absorber layer are formed on an optical surface of a glass substrate by, e.g. an ion beam sputtering method or a magnetron sputtering method.

At the time of forming the multilayer reflective film and the absorber layer, the glass substrate is held by a holding tool. Although a mechanical chuck and an electrostatic chuck are used as a glass substrate-holding tool, it is preferred in terms of a reduction in dust generation that such an electrostatic chuck be used as the glass substrate-holding tool to catch and hold the glass substrate at the time of forming the multilayer reflective film and the absorber layer, in particular at the time of forming the multilayer reflective film.

The electrostatic chuck is a technique which has been heretofore used to catch and hold a silicon wafer in a process for producing semiconductor devices. The electrostatic chuck holds a silicon wafer by an electrostatic attractive force which is generated by bringing a central portion of the silicon wafer into contact with a catching and holding surface having a planar shape in a circular shape, a rectangular shape or the like, and applying a voltage across electrode portions of the electrostatic chuck.

For catching and holding a glass substrate, the electrostatic chuck is also used such that a central portion of the glass substrate, specifically a central portion of a rear surface of the glass substrate opposite to the film deposition surface of the glass substrate with a multilayer reflective film and an absorber layer expected to be stacked thereon during the production of an EUV mask blank, is brought into contact with the catching and holding surface of the electrostatic chuck, for, e.g. reasons that the shape of the electrode portions is not complicated, that it is possible to provide a sufficient holding force, and that the caught and held glass substrate is prevented from inclining. It has been heretofore considered that it is preferred to catch and hold such a central portion of the glass substrate since it is possible to make device design simple and since it is possible to reduce costs by utilizing an electrostatic chuck widely used for catching and holding a silicon wafer.

Hereinbelow, the surface of a glass substrate with a multilayer reflective film or an absorber layer expected to be stacked thereon during the production of an EUV mask blank is referred to as the "film deposition surface" of the glass substrate, and the rear surface of the glass substrate opposite to the film deposition surface is referred to as the "rear surface" in the specification.

However, when a glass substrate is held by bringing a central portion of the rear surface of the glass substrate into contact with the catching and holding surface of an electrostatic chuck, it is likely that foreign substances deposit on the central portion of the rear surface of the glass substrate, or that the central portion of the rear surface of the glass substrate is scratched. In the case of a glass substrate used for production of EUV mask blank, the central portion of the rear surface of the glass substrate is a portion that is also usually designated as a quality-guaranteed region for every device, such as an exposure system, and is required to be free from the deposition of foreign substances or the occurrence of scratches. From this point of view, the deposition of foreign substrates or the occurrence of scratches on the central portion of the rear surface could cause a serious problem.

It appears to be sufficient to bring an outer edge portion of the rear surface of a glass substrate except for the quality-guaranteed region into contact with the catching and holding surface of an electrostatic chuck in order to prevent the deposition of foreign substances or the occurrence of scratches on a central portion of the rear surface.

However, when the glass substrate is held by bringing the outer edge portion of the rear surface into contact with the catching and holding surface of the electrostatic chuck, the surface area of a portion of the glass substrate in contact with the catching and holding surface of the electrostatic chuck (hereinbelow referred to as "the caught and held portion" of a glass substrate in the specification) is reduced. Accordingly, when an attempt is made to provide a catching and holding force enough to hold the glass substrate, the pressure per unit area applied to the caught and held portion is increased, which is likely to cause a problem of occurrence of scratches on the caught and held portion or of occurrence of foreign substances caused by such scratches. Further, a large amount of charged foreign substances are likely to be attracted by an electrostatic field generated at the caught and held portion.

Since the caught and held portion is present on the outer edge portion of the rear surface, the effect caused by the occurrence of scratches or foreign substances is minor than a case where a similar problem is caused on the quality-guaranteed region of the rear surface. However, it is likely that foreign substances formed at the caught and held portion or a portion of foreign substances attracted to the caught and held portion is transferred to the quality-guaranteed region of the rear surface. When the caught and held portion is scratched, it is likely that the force required for holding the glass substrate is reduced in a post-process for mask blank produced on the glass substrate. Specifically, an electrostatic chuck is used as the glass substrate-holding tool to catch and hold a glass substrate in a mask patterning process for fabricating reflective masks from an EUV mask blank, or in handling of reflective masks for exposure in EUV lithography. If the caught and held portion is scratched to form a step, it is likely that the flatness of the caught and held portion is degraded to reduce the catching and holding force of the electrostatic chuck.

On the other hand, when an attempt is made to reduce the catching and holding force of an electrostatic chuck in order to prevent the caught and held portion from being scratched or a large amount of foreign substances from being caught on the caught and held portion, the catching and holding force applied to a glass substrate become insufficient, which leads to a case where the glass substrate is likely to be displaced or come off during the production of EUV mask blank.

Although explanation has been made about a case where a glass substrate is caught and held by an electrostatic chuck, there is a tool for holding a glass substrate by a mechanical chuck, which physically holds the outer edge portion of a glass substrate.

Patent Documents 1 and 2 listed below disclose that the outer edge portion of a glass substrate is held by a mechanical clamping tool (Patent Document 1) or a glass substrate-pressing tool (Patent Document 2) during the production of mask blank.

When such a tool is used, the surface area of the contact portion of such a tool in contact with a glass substrate is small. Accordingly, when such a tool is set to provide a holding force enough to hold the glass substrate, the pressure per unit area applied to the caught and held portion of the glass substrate is increased, which leads to a case where it is likely to cause a problem of occurrence of scratches on the caught and held portion or of occurrence of foreign substances caused by such scratches as in the electrostatic chuck.

PRIOR ART DOCUMENTS

Patent Documents

Patent Document 1: JP-A-2006-49910
Patent Document 2: JP-A-2005-77845

DISCLOSER OF INVENTION

Object to be Accomplished by Invention

In order to solve the above-mentioned problems of the prior art, it is an object of the present invention to provide a glass substrate-holding tool which is capable of preventing a glass substrate from being displaced or coming off and controlling the occurrence of scratches or the deposition of foreign substances on the glass substrate caused by holding action during the production of an EUV mask blank, and a method for producing EUV mask blank and a functional film-provided substrate for EUV mask blank by employing the glass substrate-holding tool.

SUMMARY OF INVENTION

The present invention provides a glass substrate-holding tool which is adapted to be employed during the production of a reflective mask blank for EUV lithography (EUVL), and which includes:

an electrostatic chuck configured to catch and hold a portion of a rear surface of a glass substrate; and a mechanical chuck including pressing portions and configured to press portions of a film deposition surface of the glass substrate by the pressing portions so as to clamp and hold the glass substrate from a side of the film deposition surface and a side of the rear surface;

wherein a caught and held portion of the glass substrate caught and held by the electrostatic chuck, and pressed portions of the glass substrate pressed by the mechanical chuck are located outside a quality-guaranteed region on each of the film deposition surface and the rear surface of the glass substrate;

wherein the sum of a catching and holding force applied to the glass substrate by the electrostatic chuck and a holding force applied to the glass substrate by the mechanical chuck is at least 200 kgf; and wherein a pressing force per unit area applied to the glass substrate by the mechanical chuck is at most 25 $kgf/mm^2$.

In the glass substrate-holding tool according to the present invention, it is preferred that the angle formed by a pressing surface of each pressing portion and the film deposition surface of the glass substrate be from 5° to 70°.

In the glass substrate-holding tool according to the present invention, it is preferred that each pressing portion of the mechanical chuck be made of a material having a lower hardness than the glass substrate.

It is preferred that the glass substrate have a rectangular planar shape, the pressed portions of the glass substrate pressed by the mechanical chuck be present at at least two locations, and at least two pressed portions be present at positions contained in two opposing sides of four sides forming an outer edge of the film deposition surface of the glass substrate or at positions close to the two opposing sides, respectively.

It is preferred that the glass substrate have a rectangular planar shape, and that the substrate-holding tool further include positioning devices satisfying the following requirements:

(1) Each positioning device includes a guide surface or curved guide surface which is inclined to a side surface and a bottom surface of the glass substrate, and the guide surface or curved guide surface is configured to be brought into contact with a side forming the boundary between the side surface and the bottom surface of the glass substrate when placing the glass substrate on the glass substrate-holding tool.

(2) The positioning devices are disposed at least one location on each of two orthogonal sides of four sides forming the boundary between the side surface and the bottom surface of the glass substrate.

(3) When the guide surface or curved guide surface of the positioning devices are brought into contact with the side forming the boundary between the side surface and the bottom surface of the glass substrate, the angle formed by the guide surface or guide curved surface and the bottom surface of the glass substrate is from at least 5° to not larger than 90°.

In a case where each substrate-positioning device is disposed at a single location with respect to each of the two orthogonal sides, when a side with each substrate-positioning device disposed has a length of L (mm), it is preferred that the distance between an edge of a portion of the side in contact with the guide surface or curved guide surface and an edge of the side be at least 0.1 L.

In the glass substrate-holding tool according to the present invention, it is preferred that each positioning device be made of a material having a lower hardness than the glass substrate.

Further, the present invention provides a method for producing a reflective layer-provided substrate for EUV lithography (EUVL) having an EUV light reflective layer formed on one surface of the glass substrate, wherein the glass substrate-holding tool according to the present invention is employed to hold the glass substrate when the reflective layer is formed on the glass substrate by a dry deposition method.

Further, the present invention provides a method for producing a reflective mask blank for EUV lithography (EUVL) having an EUV light reflective layer and an EUV light absorber layer formed at least in this order on one surface of a glass substrate, wherein the glass substrate-holding tool according to the present invention is employed to hold the glass substrate when at least one of the reflective layer and the absorber layer is formed on the glass substrate by a dry deposition method.

When the glass substrate-holding tool includes the above-mentioned glass substrate positioning devices in the method for producing a reflective layer-provided substrate for EUVL and the method for producing a reflective mask blank for EUVL, it is preferred that the glass substrate-holding tool and the glass substrate be positioned by bringing the guide surface or curved guide surface into contact with the side forming the boundary between the side surface and the bottom surface of the glass substrate when placing the glass substrate on the glass substrate-holding tool.

In accordance with the present invention, it is possible to prevent a substrate from being displaced or coming off and to control the occurrence of scratches or the deposition of foreign substances on the glass substrate caused by holding action during the production of EUV mask blank.

In the present invention, it is possible to carry out positioning so as to place the positional relationship between the glass substrate-holding tool and a glass substrate in a proper state by employing the glass substrate-holding tool including the glass substrate positioning devices.

BRIEF DESCRIPTION OF DRAWINGS

FIGS. 4(a) to (e) are cross-sectional views taken along line B-B' of FIG. 1 and show a procedure which is carried out until the glass substrate is held by the glass substrate-holding tool since the glass substrate is carried in the glass substrate-holding tool, wherein a mask portion and the pressing portions of a mechanical chuck mounted to the mask portion are omitted for easy understanding of the embodiment.

DETAILED DESCRIPTION OF PREFERRED EMBODIMENTS

Now, the glass substrate-holding tool according to the present invention will be described in reference to the accompanying drawings.

Figure 1:
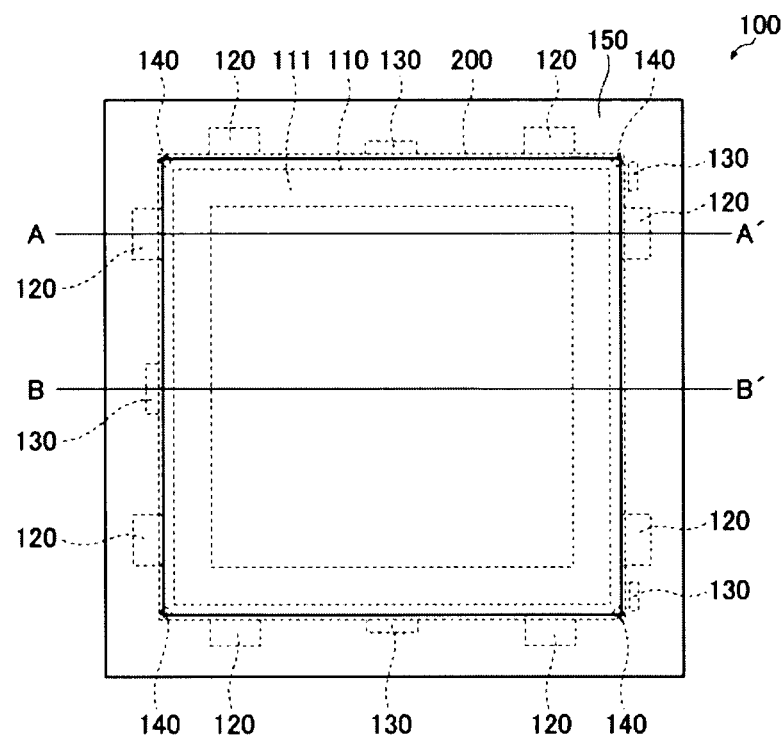
FIG. 1 is a schematic plan view showing the glass substrate-holding tool according to an embodiment of the present invention wherein a glass substrate is shown to be carried in the substrate-holding tool.
Figure 2:
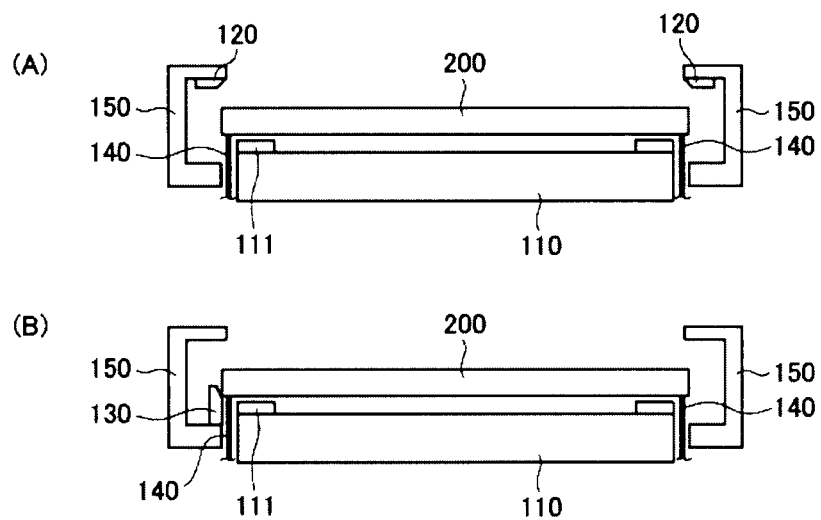
FIGS. 2(A) and (B) are a cross-sectional view taken along line A-A' of FIG. 1 and a cross-sectional view taken along line B-B' of FIG. 1, respectively, and schematically illustrate states at the time of carrying in and out the glass substrate.
Figure 3:
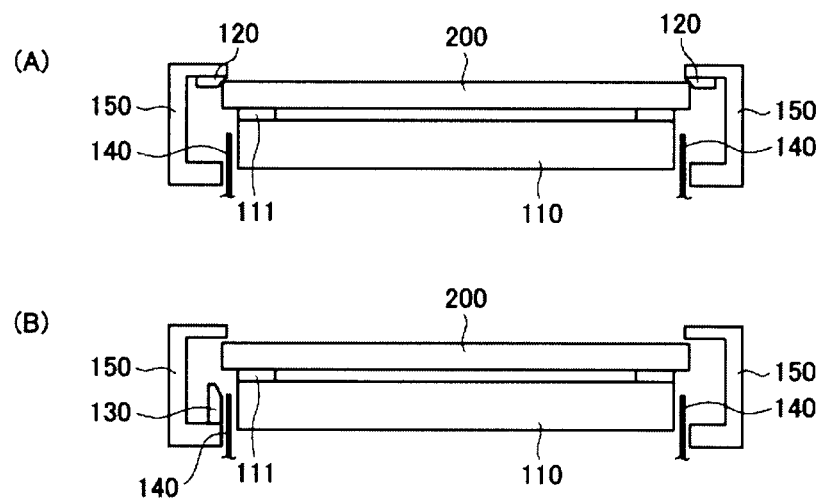
FIGS. 3(A) and (B) are a cross-sectional view taken along line A-A' of FIG. 1 and a cross-sectional view taken along line B-B' of FIG. 1, respectively, and schematically illustrate states at the time of holding the glass substrate.

FIG. 1 is a schematic plan view showing the glass substrate-holding tool according to an embodiment of the present invention. FIGS. 2(A) and 3(A) are cross-sectional views taken along line A-A' of FIG. 1. FIGS. 2(B) and 3(B) are cross-sectional views taken along line B-B' of FIG. 1. In these figures, a glass substrate is shown to be carried in the glass substrate-holding tool in order to clarify how to hold the glass substrate by the glass substrate-holding tool according to the present invention. Further, FIGS. 2(A) and (B) illustrate states at the time of carrying in and out the glass substrate illustrate, and FIGS. 3(A) and (B) illustrate states at the time of holding the glass substrate.

The glass substrate-holding tool according to the present invention includes an electrostatic chuck and a mechanical chuck and holds a glass substrate by employing these chucks.

In the glass substrate-holding tool 100 according to the present invention, the mechanical chuck 110 catches and holds a rear surface of a glass substrate 200.

When attention is focused on the catching and holding of the rear surface of the glass substrate 200 by the electrostatic chuck 110, supporting pins 140, which support portions of the rear surface of the glass substrate 200 close to the edge portions at four corners thereof, may be lowered to bring the rear surface of the glass substrate 200 into contact with an upper surface (catching and holding surface) of a catching and holding portion 111 of the electrostatic chuck 110 in order to transfer a state at the time of carrying in the glass substrate 200 as shown in FIGS. 2(A) and (B) to a state at the time of holding the glass substrate 200 as shown in FIGS. 3(A) and (B).

As described above, in the conventional electrostatic chucks, a central portion of a glass substrate, specifically a central portion of the rear surface of a glass substrate has been brought into contact with the catching and holding surface of the conventional electrostatic chucks to catch and hold the glass substrate.

In contrast, in the glass substrate-holding tool 100 according to the present invention, instead of a quality-guaranteed region which is present on a central portion of the rear surface of the glass substrate 200, a portion of the rear surface outside the quality-guaranteed region (hereinbelow referred to as "outer peripheral portion on the rear surface") is brought into contact with the catching and holding surface of the electrostatic chuck (the upper surface of the catching and holding portion 111) to catch and hold the glass substrate. For this purpose, in the electrostatic chuck 110 of the shown glass substrate-holding tool 100, the electrostatic chuck 110 has a convex portion disposed on an outer peripheral portion of an upper surface thereof such that the convex portion provides the catching and holding portion 111 for contact with the outer peripheral portion on the rear surface of the glass substrate 200.

When the glass substrate 200 is a glass substrate of 152.4 mm×152.4 mm, the quality-guaranteed region on the rear surface of the glass substrate 200 is usually a region of 144 mm×144 mm. Accordingly, when the glass substrate 200 is placed on the electrostatic chuck 110, it is sufficient that the convex portion forming the catching and holding portion 111 is disposed so as to be brought into contact with a portion of the glass substrate outside the region of 144 mm×144 mm. It is preferred that the convex portion forming the catching and holding portion 111 be disposed so as to be brought into contact with a portion of the glass substrate outside the region of 146 mm×146 mm. It is more preferred that the convex portion forming the catching and holding portion 111 be disposed so as to be brought into contact with a portion of the glass substrate outside the region of 147 mm×147 mm. It is further preferred that the convex portion forming the catching and holding portion 111 be disposed so as to be brought into contact with a portion of the glass substrate outside the region of 148 mm×148 mm. When the quality-guaranteed region on the rear surface of the glass substrate is different from the region of 144 mm×144 mm, a similar idea may be taken such that the convex portion forming the catching and holding portion 111 is disposed so as to be brought into contact with a portion of the glass substrate outside the quality-guaranteed region, preferably outside a region of the quality-guaranteed region plus an extension formed by extending the respective sides by 2 mm, more preferably a region of the quality-guaranteed region plus an extension formed by extending the respective sides by 3 mm, further preferably a region of the quality-guaranteed region plus an extension formed by extending the respective sides by 4 mm.

As the method for disposing the convex portion forming the catching and holding portion 111 on the outer peripheral portion of the upper surface of the electrostatic chuck 110 as in the shown electrostatic chuck 110, the electrostatic chuck may have a dielectric layer as the outermost layer embossed.

Although the convex portion forming the catching and holding portion 111 is disposed in the form of a frame along the outer peripheral portion on the upper surface of the electrostatic chuck 110 in the shown electrostatic chuck 110, the location of the convex portion forming the catching and holding portion on the electrostatic chuck, and the shape, the size and the like of the convex portion are not limited as long as the convex portion disposed on the upper surface of the electrostatic chuck is brought into contact with the outer peripheral portion of the rear surface of a glass substrate when the glass substrate is placed on the electrostatic chuck. For example, the convex portion forming the catching and holding portion may be disposed only on each of the corners of the outer peripheral portion of the upper surface of an electrostatic chuck, or to the contrary, the convex portion forming the catching and holding portion may be disposed only on each of portions except for the corners. In these modes, a plurality of convex portions are disposed on the upper surface of an electrostatic chuck. Accordingly, when a glass substrate is placed on the electrostatic chuck, it should be noted that such a plurality of convex portions are disposed on the electrostatic chuck in order to horizontally hold the glass substrate.

In order to bring only the convex portion disposed on the upper surface of the electrostatic chuck into contact with the rear surface of a glass substrate when the glass substrate is placed on the electrostatic chuck, the convex portion has a height of preferably at least 5 µm, more preferably at least 10 µm, further preferably at least 15 µm. When the convex portion has a height of less than 5 µm, it is likely that the convex portion is deformed by a catching and holding force to bring the rear surface of the glass substrate into contact with a portion of the electrostatic chuck other than the convex portion. It is also likely that foreign substances, which are present on a portion of the electrostatic chuck other than the convex portion, are brought into contact with the rear surface of the glass substrate, whereby the foreign substances are transferred on the rear surface of the glass substrate.

When the height of the convex portion is too high, it is likely that the catching and holding force by the electrostatic chuck reduces. Accordingly, the convex portion has a height of preferably at most 100 µm, more preferably at most 50 µm, further preferably at most 30 µm.

In the glass substrate-holding tool according to the present invention, it is preferred that the dielectric layer forming the outermost layer of the electrostatic chuck be made of a material which is nonconductive, has a rigidity to minimize deformation by a holding force and is excellent in wear resistance. On the other hand, in order to prevent a glass substrate from being scratched when catching and holding the glass substrate, it is preferred that the dielectric layer be made of a material having a lower hardness than the glass substrate. The material satisfying such properties may be, for example, a polyimide film, such as Apical (trademark) manufactured by Kaneka Corporation, or a fluororesin film, such as Nitoflon (trademark) manufactured by Nitto Denko Corporation. Among them, a polyimide film, such as Apical (trademark) manufactured by Kaneka Corporation, is preferred because of being excellent in wear resistance.

With respect to the recommended hardness of the dielectric layer, explanation of pressing portions of the mechanical chuck described later may be referred to.

In the glass substrate-holding tool 100 according to the present invention, the mechanical chuck includes pressing portions 120. The pressing portions 120 can partly press a film deposition surface of the glass substrate 200 to clamp and hold the glass substrate 200 from both sides of the film deposition surface and the rear surface. FIG. 3(A) illustrates a state at the time of holding the glass substrate 200. In FIG. 3(A), the glass substrate 200 is clamped and held from both sides of the film deposition surface and the rear surface by the pressing portions 120 and the convex portion forming the catching and holding portion 111 of the electrostatic chuck 110.

When attention is focused on the pressing operation to the film deposition surface of the glass substrate 200 by the pressing portions 120, a mask 150 with the pressing portions 120 mounted thereto may be relatively lowered with respect to the glass substrate 200 in order to transfer the state at the time of carrying in the glass substrate 200 as shown in FIG. 2(A) to the state at the time of holding the glass substrate as shown in FIG. 3(A). It should be noted that the mask 150 is disposed for the purpose of preventing a film material from wrapping around toward side surfaces of the glass substrate 200 during a film deposition process performed at the time of producing EUV mask blank.

In the glass substrate-holding tool 100 according to the present invention, the pressing portions 120 press a portion of the glass substrate 200 outside the quality-guaranteed region present in a central portion of the film deposition surface (hereinbelow referred as "outer peripheral portion on the film deposition surface" in the specification). As described above, the glass substrate 200 is clamped and held from both sides of the film deposition surface and the rear surface at an outer peripheral portion of the glass substrate 200 (the outer peripheral portion on the film deposition surface and the outer peripheral portion on the rear surface) since the catching and holding surface of the electrostatic chuck 110 (the upper surface of the catching and holding portion 111) is brought into contact with the outer peripheral portion on the rear surface of the glass substrate 200. Accordingly, the constituent elements of the glass substrate-holding tool 100, such as the pressing portions 120 of the mechanical chuck and the catching and holding surface of the electrostatic chuck 110 (the upper surface of the catching and holding portion 111), are prevented from being brought into contact with the film deposition surface of the glass substrate 200 and the quality-guaranteed region present in the central portion of the rear surface.

Thus, it is possible to control the occurrence of scratches or the deposition of foreign substances on the quality-guaranteed region of the glass substrate (the film deposition surface and the quality-guaranteed region on the rear surface) caused by holding action.

When the glass substrate 200 is a glass substrate of 152.4 mm×152.4 mm, since the quality-guaranteed region on the rear surface of the glass substrate 200 is usually a region of 148 mm×148 mm about the center, it is sufficient that the pressing portions 120 of the mechanical chuck are disposed so as to press a portion of the glass substrate outside the region of 148 mm×148 mm. It is preferred that the pressing portions be disposed so as to press a portion of the glass substrate outside a region of 150 mm×150 mm. When the quality-guaranteed region on the rear surface of the glass substrate is different from the region of 148 mm×148 mm, a similar idea may be taken such that the convex portions forming the catching and holding portion 111 are disposed so as to be brought into contact with a portion of the glass substrate outside the quality-guaranteed region, preferably outside a region of the quality-guaranteed region plus an extension formed by extending the respective sides by 2 mm.

When the outer peripheral portion of the film deposition surface of the glass substrate is chamfered, it is preferred that the pressing portions of the mechanical chuck be disposed so as to press the chamfered portion.

In FIG. 2(A) and FIG. 3(A), the pressing portions 120 have pressing surfaces inclined to the film deposition surface of the glass substrate 200 which is pressed by the pressing portions 120.

As in the shown mode, in the glass substrate-holding tool 100 according to the present invention, it is preferred that the pressing surfaces of the pressing portions 120 be inclined to the film deposition surface of the glass substrate 200 which is pressed by the pressing portions 120. The reason is that it becomes possible to press a further outer part of the outer peripheral portion on the film deposition surface. In FIG. 3(A), the pressing portions 120 press sides forming the boundary between the film deposition surface and the side surfaces of the glass substrate 200.

It is preferred in the light of controlling the occurrence of scratches or the deposition of foreign substances on the quality-guaranteed region of a glass substrate (the quality-guaranteed region on the film deposition surface) caused by the holding action that such a further outer part of the outer peripheral portion on the film deposition surface be pressed.

It is preferred also in the light of the following the reason that the pressing surfaces of the pressing portions 120 be inclined to the film deposition surface of the glass substrate 200.

Each glass substrate-pressing tool 4 disclosed in Patent Document 2 (hereinbelow, the symbols used for explanation of Patent Document 2 are the same as the symbols used in Patent Document 2) is configured such that a claw 41*a* which forms a leading edge of a clamping member 41 is brought into contact with a principal plane 1*a* of a substrate 1 when pressing the substrate 1. When each claw has been brought into contact with the principal plane, a contact surface of each claw 41*a* is placed in a state parallel to the principal plane 1*a*, in other words, both are brought into surface contact. When each glass substrate-pressing tool is configured as described above, a portion of the substrate 1 has a film material adhering so as to continuously extend on both of the principal plane 1*a* (the film deposition surface according to the present invention) and each claw 41*a* in a film deposition procedure performed during the production of EUV mask blank. When the pressing operation of each glass substrate-pressing tool 4 is released, a portion of the film on such a portion of the substrate is likely to come off to form foreign substances.

In contrast, when the pressing surfaces of the pressing portions 120 are inclined to the film deposition surface of the glass substrate 200 as in the mode shown in FIGS. 2(A) and 3(A), a portion of the substrate 1 is hardly to have the film material adhering so as to continuously extend on both of the film deposition surface and each pressing portion 120 in a film deposition procedure performed during the production of EUV mask blank. Thus, it is possible to control the coming-off of the film and the occurrence of foreign substances when releasing the pressing operation by the pressing portions 120.

In the glass substrate-holding tool 100 according to the present invention, it is preferred that the angle formed by the pressing surface of each pressing portion 120 and the film deposition surface of the glass substrate 200 be from 5° to 70°. When the angle formed both surfaces is less than 5°, both surfaces are placed in a state close to a parallel state as in the glass substrate-holding tools disclosed in Patent Document 2. Accordingly, a portion of the substrate 200 is likely to have the film material adhering so as to continuously extend on both of the film deposition surface and each pressing portion 120. As a result, it is likely that a portion of the film comes off to form foreign substances when the pressing operation of the pressing portions 120 is released.

Since a further inner portion of the outer peripheral portion on the film deposition surface is pressed in this case, this case is not preferred in the light of controlling the occurrence of scratches or the deposition of foreign substances on the quality-guaranteed region on the glass substrate (the quality-guaranteed region on the film deposition surface) caused by holding action.

On the other hand, the angle formed by both surfaces is beyond 70°, it is likely to make it difficult to press a glass substrate since each pressing portion is deformed so as to be along the side surface of the glass substrate. The angle formed by both surfaces is preferably from 10° to 65°, more preferably from 20° to 60°, further preferably from 30° to 55°.

Although the pressing surface of each pressing portion 120 of the mechanical chuck is formed as a flat surface in FIGS. 2(A) and 3(A), the pressing surface of each pressing portion of the mechanical chuck may be formed as a curved surface. In this case, the angle formed by the film deposition surface of a glass substrate and a tangent at a position in contact with the film deposition surface of the glass substrate on the curved surface forming each pressing portion corresponds to the above-mentioned angle formed by each pressing surface and the film deposition surface.

In FIG. 1, a pair of the pressing portions 120 of the mechanical chuck is disposed with respect to each of the four sides forming the outer edge of the film deposition surface of the glass substrate 200 formed in a rectangular shape. In other words, a pair of pressed portions to be pressed by the mechanical chuck (by the pressing portions 120 of the mechanical chuck) is present at a position containing each side forming the outer edge or a position close to each side forming the outer edge with respect to each of the four sides forming the outer edge of the film deposition surface of the glass substrate 200.

The case where a pair of pressed portions to be pressed by the mechanical chuck is present at a position containing each side forming the outer edge means a case where a pair of pressed portions to be pressed by the mechanical chuck (by the pressing portions 120 of the mechanical chuck) is present on each side forming the outer edge of the film deposition surface of the glass substrate 200 as shown in FIG. 3(A). Taking into account that not only each side forming the outer edge but also a portion of the film deposition surface further inner than a side forming the outer edge is pressed according to the shape of the pressing portions 120 in some case, it is recited that such a pair of pressed portions to be pressed by the mechanical chuck is present at a position containing each side forming the outer edge.

On the other hand, the case where a pair of pressed portions to be pressed by the mechanical chuck is present at a position close to each side forming the outer edge means a case where no pair of pressed portions to be pressed by the mechanical chuck (by the pressing portions 120 of the mechanical chuck) is present on each side forming the outer edge of the film deposition surface of the glass substrate 200, and a pair of pressed portions to be pressed by the mechanical chuck is present only on a portion of the film deposition surface further inner than each side forming the outer edge.

In the following description, a case where a pair of pressed portions to be pressed by the mechanical chuck is present at a position containing each side forming the outer edge, and a case where a pair of pressed portions is present at a position close to each side forming the outer edge are collectively recited by using an expression that a pair of pressed portions to be pressed by the mechanical chuck is present on each side forming the outer edge.

Although a pair of the pressed portions to be pressed by the mechanical chuck (by the pressing portions 120) is present on each of the four sides forming the outer edge of the film deposition surface of the glass substrate 200 in FIG. 1, the number of the pressed portions with respect to each side forming the outer edge is not limited to such a particular number. The pressed portions may be present at a single location or at least three locations on each side. The number of the pressed portion may be different for each side forming the outer edge.

Although the pressed portions to be pressed by the mechanical chuck (by the pressing portions 120 of the mechanical chuck) are present on all of the four sides forming the outer edge of the film deposition surface of the glass substrate 200 in FIG. 1, the present invention is not limited to this mode.

In the glass substrate-holding tool 100 according to the present invention, it is possible to horizontally hold the glass substrate 200 as long as the pressed portions to be pressed by the mechanical chuck are present on at least two opposed sides (such as, an upper side and a lower side in FIG. 1) among the four sides forming the outer edge of the film deposition surface of the glass substrate 200.

In the glass substrate-holding tool according to the present invention, it is preferred that the pressed portions to be pressed by the mechanical chuck be present on three sides among the four sides forming the outer edge of the film deposition surface of a glass substrate, and it is more preferred that the pressed portions to be pressed by the mechanical chuck be present on all of the four sides.

In the glass substrate-holding tool according to the present invention, the pressing portions of the mechanical chuck are required to have a sufficient hardness so as not to be broken when pressing a glass substrate.

However, when the pressed portions have a higher hardness than a glass substrate to be pressed, it is likely that the glass substrate is scratched at the time of pressing.

For this reason, it is preferred that the pressing portions be made of a material having a lower hardness than a glass substrate to be pressed.

Only as a guide, the pressing portions have a hardness of preferably less than 650, more preferably less than 100, further preferably less than 30 in Vickers hardness (HV).

In the glass substrate-holding tool according to the present invention, the pressing portions of the mechanical chuck should not emit a gas component under vacuum atmosphere in a film deposition vessel because of being subjected to a film deposition process performed during the production of EUV mask blank. Further, the pressing portions of the mechanical chuck are required to have a chemical and physical heat resistance to at least about 150° C. since, e.g. a substrate has a heat in a film deposition device in some cases.

In order to satisfy the above-mentioned requirements, the pressing portions of the mechanical chuck may, for example, be made of an elastomer material such as perfluoro elastomer, fluoro rubber or silicone rubber, polyether ether ketone (PEEK), polyimide, a polybenzimidazole (PBI) resin, or a fluororesin. Among them, perfluoro elastomer, or fluoro rubber is preferred, and perfluoro elastomer is more preferred.

The glass substrate-holding tool according to the present invention is required to hold a glass substrate without being displaced or coming off during the production of EUV mask blank.

The glass substrate-holding tool according to the present invention is capable of holding a glass substrate without being displaced or coming off during the production of EUV mask blank since the sum of the catching and holding force applied to a glass substrate by the electrostatic chuck and the holding force applied to the glass substrate by the mechanical chuck is as high as at least 200 kgf.

In the glass substrate-holding tool according to the present invention, the sum of the catching and holding force applied to a glass substrate by the electrostatic chuck and the holding force applied to the glass substrate by the mechanical chuck is preferably at least 240 kgf, more preferably at least 280 kgf.

When the outer peripheral portion on the rear surface of a glass substrate is caught and held by the electrostatic chuck as described above, the surface area of the caught and held portion of the glass substrate becomes small. Accordingly, when the electrostatic chuck provides a catching and holding force enough to hold a glass substrate, the pressure per unit area applied to the caught and held portion is increased, which is likely to cause a problem of occurrence of scratches on the caught and held portion or of occurrence of foreign substances caused by such scratches. Further, since electrostatic attraction (coulomb force or dielectric attraction) is locally applied to the caught and held portion, a large amount of foreign substances are likely to be attracted to the caught and held portion by the residual electric charge or leaking electric field.

Since the caught and held portion is present on the outer edge portion of the rear surface, the effect caused by the occurrence of scratches or foreign substances is minor than a case where a similar problem is caused on the quality-guaranteed region of the rear surface. However, it is likely that foreign substances formed at the caught and held portion or a portion of foreign substances attached to the caught and held portion is transferred to the quality-guaranteed region of the rear surface.

This is also applicable to a case where the outer peripheral portion of the film deposition surface of a glass substrate is held by the mechanical chuck. When an attempt is made to provide a holding force enough to hold the glass substrate, the pressure per unit area applied to the caught and held portion of the glass substrate is increased, which is likely to cause a problem of occurrence of scratches on the caught and held portion or of occurrence of foreign substances caused by such scratches.

The requirements for defects on the outer peripheral portion of the film deposition surface and the outer peripheral portion on the rear surface of a glass substrate will be described along with the requirements for defects on the quality-guaranteed region of each of the film deposition surface and the rear surface.

In the glass substrate-holding tool according to the present invention, the catching and holding action by the electrostatic chuck and the holding action by the mechanical chuck can be combined to provide a holding force enough to hold a glass substrate without excessively increasing the pressure per unit area applied to held portions of the glass substrate (the pressure per unit area applied to the caught and held portion by the electrostatic chuck and the pressure per unit area applied to the pressed portions by the mechanical chuck). Thus, it is possible to not only control the occurrence of scratches or the deposition of foreign substances on the outer peripheral portion of the film deposition surface and the outer peripheral portion of the rear surface of a glass substrate but also prevent the glass substrate from being displaced or coming off during the production of EUV mask blanks.

In the glass substrate-holding tool according to the present invention, it is sufficient that the sum of the catching and holding force applied to a glass substrate by the electrostatic chuck and the holding force for the glass substrate by the mechanical chuck is at least 200 kgf. Although there is no particular upper limit, at most 500 kgf is recommendable since it is possible to hold the glass substrate without applying an excessive force to the substrate. The application of an excessive force to the substrate is not preferred since the substrate is deformed in some cases.

Although the proportion of both holding forces by the respective chucks is not particularly limited, when the pressing force per unit area applied to a glass substrate by the mechanical chuck is too large, it is likely to cause a problem of occurrence of scratches on the pressed portions of a glass substrate or of occurrence of foreign substances caused by such scratches.

From this point of view, the pressing force per unit area applied to a glass substrate by the mechanical chuck is required to be at most 25 $kgf/cm^2$.

In the glass substrate-holding tool according to the present invention, the pressing force per unit area applied to a glass substrate by the mechanical chuck is preferably at most 10 $kgf/cm^2$, more preferably at most 5 $kgf/cm^2$, further preferably at most 1 $kgf/cm^2$.

In the glass substrate-holding tool according to the present invention, the catching and holding force applied to a glass substrate by the electrostatic chuck is preferably at least 30 kgf, more preferably at least 50 kgf, more preferably at least 100 kgf, further more preferably at least 150 kgf. The catching and holding force applied to a glass substrate by the electrostatic chuck is preferably at most 250 kgf, more preferably at most 200 kgf.

In the glass substrate-holding tool according to the present invention, the holding force applied to a glass substrate by the mechanical chuck is preferably at most 250 kgf, more preferably at most 200 kgf, further preferably at most 150 kgf. The holding force applied to a glass substrate by the mechanical chuck is preferably at least 30 kgf, more preferably at least 50 kgf.

When the glass substrate-holding tool 100 shown in FIGS. 1 to 3(B) is used, a transporting device, such as a robot arm (not shown), is employed to transport the glass substrate 200 to a position above the electrostatic chuck 110 (specifically, a position where portions of the glass substrate 200 close to the four corners are located above the supporting pins 140), and the portions of the glass substrate 200 close to the four corners are held by the supporting pins 140 from the rear surface. Hereinbelow, in the specification, the procedure where the transporting device is employed to transport the glass substrate to such a position above the electrostatic chuck, and the portions of the glass substrate close to the four corners are held by the supporting pins from the rear surface is referred to as a procedure for placing the glass substrate on the glass substrate-holding tool.

Next, the glass substrate 200 is released from a holding action by the transporting device, and the transporting device is moved outside the glass substrate-holding tool 100. When the transporting device is an robot arm 300 described later, the robot arm 300 is withdrawn and is moved outside the glass substrate-holding tool 100. Next, the supporting pins 140 are lowered to bring the rear surface of the glass substrate 200 into contact with the catching and holding surface of the electrostatic chuck 110 (the upper surface of the catching and holding portion 111), whereby the glass substrate 200 is caught and held by the electrostatic chuck 110. After that, the mask 150 with the pressing portions 120 mounted thereto is relatively lowered to the glass substrate 200 to clamp and hold the glass substrate 200 by the pressing portions 120 and the catching and holding surfaces 111 of the electrostatic chuck 110.

In the above-mentioned process, it is important to perform a positioning operation such that the positional relationship between the glass substrate-holding tool and the glass substrate is put in a proper state, specifically, perform a positioning operation such that both constantly keep a horizontal positional relationship when placing the glass substrate on the glass substrate-holding tool. Hereinbelow, in the specification, when it is recited that the positional relationship between the glass substrate-holding tool and the glass substrate is put in a proper state, it is meant that both constantly keep a horizontal positional relationship.

When the positional relationship between the glass substrate-holding tool and the glass substrate is not put in a proper state, it is likely that a film material adheres to the outer peripheral portion of the film deposition surface of the glass substrate during the film deposition procedure performed during the production of EUV mask blank. It is not preferred for reasons, such as the generation source of foreign substances that the film material adhere to the outer peripheral portion of the film deposition surface of the glass substrate.

When the positional relationship between the glass substrate-holding tool 100 and the glass substrate 200 is not put in a proper state, it is meant that any one of the four corners on the rear surface of the glass substrate 200 is not located above the corresponding supporting pin 140. When the glass substrate 200 is released from a holding action by the transporting device, it is likely that the glass substrate 200 comes off from that supporting pin 140 or the glass substrate 200 is brought into contact with the catching and holding surface 111 of the electrostatic chuck 110, being inclined, which leads to the occurrence of scratches on a caught or held portion of the glass substrate 200.

For this reason, the glass substrate-holding tool according to the present invention preferably includes positioning devices which perform a positioning operation such that the positional relationship between the glass substrate-holding tool and the glass substrate is put in a proper state when placing the glass substrate on the glass substrate-holding tool.

The shown glass substrate-holding tool 100 includes positioning devices 130. As being clear from the above-mentioned explanation, it should be noted that the positioning device is not essential in the glass substrate-holding tool according to the present invention.

As shown in FIG. 2(B), each positioning device 130 has a guide surface inclined to the side surfaces and the bottom surface (rear surface) of the glass substrate 200, and the guide surface is brought into contact with a side forming the boundary between the side surface and the bottom surface (rear surface) of the glass substrate 200 (hereinbelow, referred to as "bottom side of the glass substrate") when placing the glass substrate 200 on the glass substrate-holding tool 100. Since the guide surface of each positioning device 130 is inclined to the side surface and the bottom surface (rear surface) of the glass substrate 200, the glass substrate 200 is moved downward by gravity when the bottom side of the glass substrate 200 is brought into contact with the guide surface of each positioning device 130. When each positioning device 130 is placed in a proper position to the electrostatic chuck 110 of the glass substrate-holding tool 100 in this case, the glass substrate 200 is moved downward by gravity, whereby the positioning operation can be performed such that the positional relationship between the glass substrate-holding tool 100 and the glass substrate 200, more specifically, the positional relationship between the electrostatic chuck 110 of the glass substrate-holding tool 100 and the glass substrate 200 is put in a proper state.

FIGS. 4(a) to (e) are views showing a positioning procedure where the positional relationship between the glass substrate-holding tool 100 and the glass substrate 200 is put in a proper state by the positioning devices 130 when placing the glass substrate 200 on the glass substrate-holding tool 100. These figures correspond to cross-sectional views taken along line B-B' in FIG. 1. It should be noted that, among the constituent elements of the glass substrate-holding tool 100, the mask 150, and the pressing portions 120 of the mechanical chuck mounted to the mask portion 150 are omitted in these figures for easy understanding.

In FIGS. 4(a) to (e), the robot arm 300 is employed as the transporting device for the glass substrate 200. In FIG. 4(a), the glass substrate 200 is carried on the robot arm 300 outside the glass substrate-holding tool 100. The robot arm 300 is advanced from this state to move the glass substrate 200 to a position above the electrostatic chuck 110 of the glass substrate-holding tool 100 as shown in FIG. 4(b). Hereinbelow, when the robot arm 300 is moved in a left direction in these figures, it will be recited that the robot arm 300 is advanced. When the robot arm 300 is moved in a right direction in these figures, it will be recited that the robot arm 300 is withdrawn. When the robot arm 300 is moved in an upper direction in these figures, it will be recited that the robot arm 300 is raised. When the robot arm 300 is moved in a lower direction in these figures, it will be recited that the robot arm 300 is lowered.

Next, the robot arm 300 is lowered to bring the bottom side of the glass substrate 200 into contact with the guide surface of each positioning device 130 as shown in FIG. 4(c). Although one positioning device 130 is shown to be located only on the left side in FIG. 4(c), the positioning devices 130 are present with respect to all four sides of the glass substrate 200 as shown in FIG. 1. The reason why only the positioning devices 130 on the right side have a different position from the other positioning devices in FIG. 1 is that it is expected that the robot arm 300 enters from the right side in this figure.

After that, the robot arm 300 is further lowered so as to hold the portions of the rear surface of the glass substrate 200 close to the four corners by the supporting pins 140, and the glass substrate 200 is released from the holding action by the robot arm 300.

When the robot arm 300 is lowered from a state where the bottom sides of the glass substrate 200 are brought into contact with the guide surfaces of the positioning devices 130, the glass substrate 200 is moved downward by gravity such that the positional relationship between the electrostatic chuck 110 of the glass substrate-holding tool 100 and the glass substrate 200 is put in a proper state. Then, the portions of the rear surface of the glass substrate 200 close to the four corners are held by the supporting pins 140. In order to achieve this procedure, a portion of the guide surface of each positioning device 130, which has contact with the bottom side of the glass substrate 200, is required to be located at a higher position than the upper edge of the corresponding supporting pin 140 for the glass substrate 200.

Now, as shown in FIG. 4(d), the robot arm 300 is withdrawn outside the glass substrate-holding tool 100. FIG. 2(B) corresponds to this stage.

Next, the supporting pins 140 and the positioning devices 130 (actually the mask 150 with the positioning devices 130 mounted thereto) are lowered to bring the rear surface of the glass substrate 200 into contact with the catching and holding surface of the electrostatic chuck 110 (the upper surface of the catching and holding portion 111), whereby the glass substrate 200 is caught and held by the electrostatic chuck 110 as shown in FIG. 4(e).

In the glass substrate-holding tool according to the present invention, the angle formed by the guide surface of each positioning device 130 and the bottom surface (rear surface) of the glass substrate 200 is from 5° to less than 90°.

In a case where the angle formed by both of the guide surface and the bottom surface is less 5°, when the bottom side of the glass substrate 200 is brought into contact with the guide surface of each positioning device 130, the glass substrate 200 is insufficiently held, which leads to a case where the glass substrate 200 is inclined when the glass substrate 200 is moved downward by gravity. If the glass substrate 200 is inclined when being moved downward by gravity, it is likely not only that it is impossible to perform the positioning operation such that the positional relationship between the electrostatic chuck 110 and the glass substrate 200 is put in a proper state but also that when being brought into contact with the supporting pins 140, the glass substrate 200 is horizontally moved such that the rear surface of the glass substrate 200 is scratched.

The angle formed by both of the guide surface and the bottom surface is preferably from 20° to 70°, more preferably from 30° to 60°.

Although the guide surface of each positioning device 130 is formed as a flat surface in the shown mode, the guide surface of each positioning device 130 may be formed as a curved surface. In this case, the angle formed by the bottom surface (rear surface) of the glass substrate 200 and a tangent at a position in contact with the bottom side of the glass surface on the curved surface forming the guide surface of each positioning device corresponds to the above-mentioned angle formed by the guide surface of each positioning device and the bottom surface (rear surface) of the glass substrate.

Although the positioning devices 130 are disposed with respect to all of the four sides of the glass substrate 200 in FIG. 1, the present invention is not limited to this mode.

In the glass substrate-holding tool according to the present invention, it is possible to perform the positioning operation such that the positional relationship between the electrostatic chuck 110 of the glass substrate-holding tool 100 and the glass substrate 200 is put in a proper state, as long as the positioning devices are disposed with respect to at least two orthogonal bottom sides among the four bottom sides of the glass substrate (such as, an upper side and a left side in FIG. 1).

In the glass substrate-holding tool according to the present invention, when a single positioning device is disposed with respect to at least two orthogonal bottom sides among the four bottom sides of a glass substrate, it is possible to perform the positioning operation such that the positional relationship between the electrostatic chuck of the glass substrate-holding tool and the glass substrate is put in a proper state.

In the glass substrate-holding tool according to the present invention, the positioning devices are preferably disposed with respect to three bottom sides among the four bottom sides of a glass substrate, more preferably with respect to all of the four bottom sides.

Although a single positioning device 130 is disposed with each of three bottom sides among the four bottom sides of the glass substrate 200 while two positioning devices 130 are disposed with respect to the left base side in FIG. 1 in the glass substrate-holding tool 100 shown in this figure, the number of the positioning devices for each bottom side is not limited to this mode. At least two positioning devices may be disposed with each bottom side, or a single positioning device may be disposed with respect to each bottom side.

In a case where each positioning device is disposed with respect to each of two orthogonal bottom sides among the four bottom sides of a glass substrate in the glass substrate-holding tool according to the present invention, when a bottom side with each positioning device being disposed has a length L (mm), the positioning device is preferably disposed such that the distance between an end of a portion of the bottom side in contact with the guide surface of the positioning device and the closest end of the bottom side is at least 0.1 L.

In a case where each positioning device is disposed with respect to each of two orthogonal bottom sides among the four bottom sides of a glass substrate, when the distance between the end of the portion of the bottom side in contact with the guide surface of the positioning device and the closest end of the bottom side is less than 0.1 L, the glass substrate is insufficiently held when bringing the bottom sides of the glass substrate 200 into contact with the guide surfaces of the positioning devices 130, which leads to a case where it is likely that the glass substrate 200 is inclined when the glass substrate 200 is moved downward by gravity. If the glass substrate 200 is inclined when the glass substrate is moved downward by gravity, it is likely not only that it is impossible to perform the positioning operation such that the positional relationship between the electrostatic chuck 110 and the glass substrate 200 is put in a proper state, but also that when the glass substrate 200 is brought into contact with the supporting pins 140, the glass substrate is horizontally moved, causing the rear surface of the glass substrate 200 to be scratched.

In a case where each positioning is disposed with respect to each of two orthogonal bottom sides among the four bottom sides of a glass substrate, the distance between an end of a portion of the bottom side in contact with the guide surface of each positioning device and the closest end of the bottom side is preferably at least 0.2 L, more preferably at least 0.3 L.

Even when the positioning devices are disposed with respect to two orthogonal bottom sides among the four bottom sides of a glass substrate, the above-mentioned problem is not caused as long as at least two positioning devices are disposed with respect to each of the two orthogonal bottom sides. Accordingly, the distance between an end of a portion of the bottom side in contact with the guide surface of each positioning device and the closest end of the bottom side is not limited to such a value.

In the glass substrate-holding tool according to the present invention, the positioning devices are required to have a sufficient hardness such that the positioning devices can be prevented from being broken when being brought into contact with the bottom sides of a glass substrate.

However, when the positioning devices have a higher hardness than a glass substrate, it is likely that the glass substrate is scratched when being brought into contact with the positioning devices.

For this reason, the positioning devices are preferably made of a material having a lower hardness than a glass substrate.

With regard to the recommendable hardness of the positioning devices, the hardness is preferably less than 650, more preferably at most 100, further preferably at most 30 in Vickers hardness (HV).

In the glass substrate-holding tool according to the present invention, the positioning devices should not emit a gas component under vacuum atmosphere in a film deposition vessel because of being subjected to a film deposition process performed during the production of EUV mask blank. Further, the positioning devices are preferred to have a chemical and physical heat resistance to at least about 150° C. since, e.g. a substrate has heat in a film deposition device.

In order to satisfy the above-mentioned requirements, the positioning devices may be, for example, made of a resin material, such as polyether ether ketone (PEEK), polyimide, a polybenzimidazole (PBI) resin, a fluororesin or fluorine rubber, or an elastomer material. Among them, polyether ether ketone (PEEK), polyimide or fluorine rubber is preferred, and polyether ether ketone (PEEK) is more preferred.

Now, the process for producing an EUV mask blank according to the present invention will be described.

The EUV mask blank has such a basic structure that on the film deposition surface of a glass substrate, a reflective layer to reflect EUV light and an absorber layer to absorb EUV light are formed in this order. As the reflective layer for the EUV mask blank, a multilayer reflective film is widely used which is obtained by alternately laminating a high refractive index film and a low refractive index film in a plurality of times, since it is thereby possible to accomplish a high reflectance in the EUV wavelength region.

The EUV mask blank to be produced by the method according to the present invention may have various functional layers other than as described above. Specific examples of such functional layers may be a protection layer for a reflective layer to be formed on the reflective layer, as the case requires, for the purpose of preventing the surface of the reflective layer from being oxidized, a buffer layer to be formed between the reflective layer and the absorber layer, as the case requires, for the purpose of preventing the reflective layer from receiving a damage during patterning, and a low reflective layer to an inspection light for a mask pattern to be formed on the absorber layer, as the case requires, for the purpose of improving the contrast during the inspection of the mask pattern.

Further, the glass substrate may have an electroconductive film disposed on the rear surface.

In the method for producing an EUV mask blank according to the present invention, a reflective layer and an absorber layer may be formed on the film deposition surface of a glass substrate, by a dry film deposition method, e.g. a sputtering method, such as a magnetron sputtering method or an ion beam sputtering method, a CVD method or a vacuum vapor deposition method.

In the case of producing an EUV mask blank having the above-mentioned various functional films to be formed as the case requires, the above-mentioned various functional films may be formed on the film deposition surface of the glass substrate by a dry film deposition method.

Among such film deposition methods, a suitable one may be selected for use depending on a film to be formed. However, a sputtering method, such as a magnetron sputtering method or an ion beam sputtering method, is preferred from such a viewpoint that a uniform film thickness can easily be obtained, and the takt time is short.

In the case of producing an EUV mask blank of the above-described basic structure by using the method for producing an EUV mask blank according to the present invention, a glass substrate is caught and held by the glass substrate-holding tool according to the present invention at the time of forming at least one of a reflective layer and an absorber layer by a dry film deposition method.

Therefore, only when either one of the reflective layer and the absorber layer is formed, the glass substrate may be held by the glass substrate-holding tool according to the present invention, and when the remaining one is formed, another holding tool (such as an ordinary electrostatic chuck) may be used to hold the glass substrate.

However, when a glass substrate is held by the glass substrate-holding tool according to the present invention, it is possible not only to prevent the glass substrate from displacing or coming off but also to control the occurrence of scratches or the deposition of foreign substances caused by the holding action during the production of an EUV mask blank, as described above. Accordingly, it is preferred to hold the glass substrate by using the glass substrate-holding tool according to the present invention, at the time of forming all of them.

In the case of producing an EUV mask blank having the above-described various functional films to be formed as the case requires, it is preferred to hold the glass substrate by the glass substrate-holding tool according to the present invention also at the time of forming such various functional films by a dry film deposition method.

In such productions, it is possible to use the glass substrate-holding tool including the positioning devices to perform the positioning operation such that the positional relationship between the glass substrate-holding tool and the glass substrate is put in a proper state as described above.

The EUV mask blank having the above-described basic structure in a state prior to forming an absorber layer, i.e. one having a reflective layer formed on the film deposition surface of the glass substrate, is a reflective layer-provided substrate for EUVL to be produced by the method according to the present invention, which constitutes a precursor for an EUV mask blank.

In the method for producing a reflective layer-provided substrate for EUVL according to the present invention, a glass substrate is held by means of the glass substrate-holding tool according to the present invention at the time of forming a reflective layer on the film deposition surface of the glass substrate by a dry film deposition method.

Now, structural examples of the EUV mask blank to be produced by the method according to the present invention will be described.

The glass substrate to be used for the production of the EUV mask blank satisfies the properties as the substrate for an EUV mask blank.

The glass substrate has a low thermal expansion coefficient (preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C.) and is preferably excellent in smoothness, flatness and durability against a cleaning liquid to be used for cleaning a mask blank or a photomask after forming a pattern. Specifically, as the glass substrate, it is possible to use a glass having a low thermal expansion coefficient, such as a $SiO_2$—$TiO_2$ glass.

The glass substrate preferably has a smooth surface of at most 0.15 nm rms and a flatness of at most 100 nm, whereby in a photomask after forming a pattern, a high reflectance and transfer precision can be obtained.

The size, thickness, etc. of the glass substrate are suitably determined based on the designed values, etc. for the mask. In Examples given hereinafter, a $SiO_2$—$TiO_2$ glass having a size of 6 inch (152.4 mm) square and a thickness of 0.25 inch (6.3 mm) was used.

It is preferred that no defects be present on the film deposition surface of the glass substrate, in particular the quality-guaranteed region. However, even when present, in order that no phase defect will be formed by concave defects and/or convex defects, the depths of the concave defects and the heights of the convex defects are preferably at most 2 nm, and the half value widths of such concave defects and convex defects are preferably at most 60 nm.

It is preferred that no convex defects, which have a height of more than 2 nm or have a half value width of more than 60 nm, be present on the outer peripheral portion on the film deposition surface since such convex defects are possibly transferred to the quality-guaranteed region.

It is preferred that no convex defects, which have a height of more than 1 μm, be present on the rear surface of the glass substrate, in particular the quality-guaranteed region on the rear surface. It is preferred that no convex defects, which have a height of more than 1 μm, be present also on the outer peripheral portion of the rear surface of the glass substrate since such convex defects are possibly transferred to the quality-guaranteed region on the rear surface.

The property especially required for the reflective layer of an EUV mask blank is a high EUV light reflectance. Specifically, when a reflective layer surface is irradiated with light rays in a wavelength region of EUV light at an incident angle of 6°, the maximum value of the light ray reflectance in the vicinity of a wavelength of 13.5 nm is preferably at least 60%, more preferably at least 65%.

As the reflective layer for an EUV mask blank, a multilayer reflective film is widely used wherein a high refractive index film and a low refractive index film are alternately laminated in a plurality of times, since a high reflectance can thereby be accomplished in an EUV wavelength region. A specific example of such a multilayer reflective film may be a Mo/Si multilayer reflective film wherein a Mo film as a high refractive index film and a Si film as a low refractive index film are alternately laminated in a plurality of times.

In the case of a Mo/Si multilayer reflective film, in order to obtain a reflective layer with the maximum value of the EUV light ray reflectance of at least 60%, a Mo layer having a thickness of 2.3±0.1 nm and a Si layer having a thickness of 4.5±0.1 nm may be stacked so that the number of repeating times will be from 30 to 60.

Here, each layer to constitute the Mo/Si multilayer reflective film may be formed by a dry film deposition method, specifically a sputtering method, such as a magnetron sputtering method or an ion beam sputtering method, such that the a desired thickness may be obtained. For example, in the case of forming a Mo/Si multilayer reflective film by means of an ion beam sputtering method, it is preferred that a Mo layer be formed by using a Mo target as the target, using an Ar gas (gas pressure: $1.3 \times 10^{-2}$ Pa to $2.7 \times 10^{-2}$ Pa) as the sputtering gas at an ion acceleration voltage of from 300 to 1,500 V and at a film deposition rate of from 0.03 to 0.30 nm/sec to bring the thickness to be 2.3 nm, and then, a Si layer is formed by using a Si target as the target, using an Ar gas (gas pressure: $1.3 \times 10^{-2}$ Pa to $2.7 \times 10^{-2}$ Pa) as the sputtering gas at an ion acceleration voltage of from 300 to 1,500 V and at a film deposition rate of from 0.03 to 0.30 nm/sec to bring the thickness to be 4.5 nm. When this operation is taken as one cycle, the Mo layer and the Si layer are stacked by from 40 to 50 cycles to obtain a Mo/Si multilayer reflective film.

The property especially required for the absorber layer is that the EUV light ray reflectance is extremely low. Specifically, when the absorber layer surface is irradiated with light rays in a wavelength region of EUV light, the maximum light ray reflectance in the vicinity of a wavelength of 13.5 nm is preferably at most 0.5%, more preferably at most 0.1%.

In order to accomplish the above-mentioned property, the absorber layer is preferably made of a material having a high absorption coefficient of EUV light. As a specific example of the material having a high absorption coefficient of EUV light, a material composed mainly of tantalum (Ta) may be mentioned.

A specific example of the absorber layer constituted by the material composed mainly of tantalum (Ta) may be an absorber layer (TaBSiN film) containing Ta, B, Si and nitrogen (N) in the following ratio.

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

The compositional ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

The absorber layer (TaBSiN film) of the above-mentioned composition is such that its structural state is amorphous, and it is excellent in the surface smoothness.

With the absorber layer (TaBSiN film) of the above-mentioned composition, the surface roughness of the absorber layer surface can be made to be at most 0.5 nm rms. If the surface roughness of the absorber layer surface is large, the edge roughness of a pattern formed in the absorber layer becomes large, whereby the dimensional precision of the pattern becomes poor. As the pattern becomes finer, the influence of the edge roughness becomes more distinct. Therefore, the surface of the absorber layer is required to be smooth.

When the surface roughness of the absorber layer surface is at most 0.5 nm rms, the absorber layer surface is sufficiently smooth, whereby there will be no deterioration of the dimensional precision of a pattern due to an influence of edge roughness.

The thickness of the absorber layer is preferably from 50 to 100 nm.

The absorber layer (TaBSiN film) of the above-mentioned composition can be formed by means of a dry film deposition method, specifically a sputtering method, such as a magnetron sputtering method or an ion beam sputtering method. In a case where a magnetron sputtering method is employed, the absorber layer (TaBSiN film) can be formed by the following methods (1) to (3).

(1) The absorber layer (TaBSiN film) is formed by using a Ta target, a B target and a Si target and letting these individual targets discharge simultaneously in a nitrogen ($N_2$) atmosphere diluted with Ar.

(2) The absorber layer (TaBSiN film) is formed by using a TaB compound target and a Si target and letting these targets discharge simultaneously in an $N_2$ atmosphere diluted with Ar.

(3) The absorber layer (TaBSiN film) is formed by using a TaBSi compound target and letting this target having the three elements integrated discharge in an $N_2$ atmosphere diluted with Ar.

Here, among the above-mentioned methods, in a method wherein at least two targets are discharged simultaneously (method (1) or (2)), the composition of the absorber layer to be formed can be controlled by adjusting the electric power to be applied to each target.

Among the above, methods (2) and (3) are preferred in that it is thereby possible to avoid instability in the discharge or fluctuation in the composition or thickness of the film, and method (3) is particularly preferred. With the TaBSi compound target, its composition preferably is composed of from 50 to 94 at % of Ta, from 5 to 30 at % of Si and from 1 to 20 at % of B, whereby it is possible to avoid instability in the discharge or fluctuation in the composition or thickness of the film, such being particularly preferred.

The formation of the absorber layer (TaBSiN film) by the above-mentioned exemplified methods may specifically be carried out under the following film deposition conditions.

Method (2) Using TaB Compound Target and Si Target

Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied (to each target): from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec Method (3) Using TaBSi Compound Target Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied: from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec

EXAMPLES

Now, the present invention will be described with reference to Examples, but, it should be understood that the present invention is by no means restricted to such Examples.

Example 1

In Example 1, a glass substrate of 152.4 mm×152.4 mm (thickness: 6.3 mm) was held by the glass substrate-holding tool 100 shown in FIGS. 1 to 3(B). In the case of using this glass substrate as a substrate for an EUV mask blank, the quality-guaranteed region of the glass substrate of 152.4 mm×152.4 mm is a region of 148 mm×148 mm about the center on the film deposition surface side and a region of 146 mm×146 mm about the center on the rear surface side. The glass substrate 200 was made of zero expansion glass ($SiO_2$—$TiO_2$ glass) composed mainly of $SiO_2$ and had a thermal expansion coefficient of 0/° C. at 22° C. and a hardness of 650 in Vickers hardness (HV).

The dielectric layer (Apical (trademark) manufactured by Kaneka Corporation) as the outermost surface layer of the electrostatic chuck 110 was embossed such that a convex portion (catching and holding position 111) having a height of 50 μm was formed on an outer peripheral portion having a width 1 mm on the upper surface of 150 mm×150 mm.

In the glass substrate-holding tool 100, the mask 150 had an opening of 150 mm×150 mm, and the pressing portions 120 of the mechanical chuck and the positioning devices 130 mounted to the mask 150 were as follows.

Pressing Portions 120

Angle formed between the pressing surface of each pressing portion 120 and the film deposition surface of the glass substrate 200: 45°

Material: PEEK (Vickers hardness (HV): 30)

Positioning Devices 130

Angle formed by the guide surface of each positioning device 130 and the bottom surface of the glass substrate 200: 50°

Material: PEEK (Vickers hardness (HV): 30)

In accordance with the procedure shown in FIGS. 4(a) to (e), the rear surface of the glass substrate 200 was caught and held by the electrostatic chuck 110. In other words, the robot arm 300 was used to transfer the glass substrate 200 to a position above the electrostatic chuck 110, and the bottom sides of the glass substrate 200 was brought into contact with the guide surfaces of the positioning devices 130, followed by lowering the glass substrate 200 by gravity to perform the positioning operation such that the positional relationship between the electrostatic chuck 110 and the glass substrate 200 was put in a proper state. After that, the four corners of the rear surface of the glass substrate 200 were held by the supporting pins 140, the supporting pins 140 and the positioning devices 130 (actually the mask 150 with the positioning devices 130 mounted thereto) were lowered to bring the rear surface of the glass substrate 200 into contact with the catching and holding surface (the upper surface of the catching and holding portion 111) of the electrostatic chuck 110, whereby the glass substrate 200 was caught and held by the electrostatic chuck 110.

Next, the mask 150 with the pressing portions 120 mounted thereto was lowered to clamp the glass substrate 200 by the pressing portions 120 and the convex portion 111 of the electrostatic chuck 110 as shown in FIG. 3(A).

The catching and holding force applied to the glass substrate 200 by the electrostatic chuck 110, and the holding force applied to the glass substrate by the pressing portions 120 of the mechanical chuck were as follows.

Catching and holding force by the electrostatic chuck 110: 150 kgf

Holding force by the pressing portions 120: 100 kgf (Pressing force per unit area: 1 kgf/mm²)

In order to simulate a state in a film deposition process performed during the production of an EUV mask blank, the glass substrate-holding tool 100 was rotated at 30 rpm for 30 minutes, holding the glass substrate.

The displacement of the glass substrate 200 before and after the above-mentioned procedure was measured by the following procedure.

Method (1) for Measuring the Displacement of the Glass Substrate

A scale was marked on the robot arm 300 in advance, and a picture was taken at the stage shown in FIG. 4(a). Next, after the rotation of the glass substrate-holding tool 100 came to an end, another picture was taken at a stage where the glass substrate 200 was taken out of the glass substrate-holding tool 100 by means of the robot arm 300. By comparing both pictures, it was determined whether the glass substrate 200 was displaced or not. Since the displacement of the glass substrate 200 was less than 0.5 mm, it was determined that no displacement was detected.

After performing the above-mentioned procedure, the number of defects on the film deposition surface (upper surface) and the rear surface of the glass substrate 200 were measured by the following procedure.

Method for Measuring the Number of Defects

With respect to the film deposition surface (upper surface) and the rear surface of the glass substrate 200 taken out of the glass substrate-holding tool 100, the number of the defects of at least 200 nm was measured by a commercially available defect-inspecting apparatus (M1350 manufactured by Lasertec Corporation). The inspected region covered an entire region of 152 mm×152 mm. Each of the region of 148 mm×148 mm about the substrate center (central portion) on the film deposition surface, a region except for the region of 148 mm×148 mm (outer peripheral region) on the film deposition surface, a region of 144 mm×144 mm about the substrate center on the rear surface, and a region except for the region of 144 mm×144 mm (outer peripheral region) on the rear surface was evaluated in terms of the number of defects. As a result, it was revealed that the number of defects having a size of at least 200 nm on the film deposition surface and the outer peripheral portions (central portions and the outer peripheral portions) was zero.

Example 2

The catching and holding force applied to the glass substrate 200 by the electrostatic chuck 110 and the holding force applied to the glass substrate by the pressing portions 120 of the mechanical chuck were as follows. The contact areas of the pressing portions 120 in contact with the glass substrate 200 were reduced to modify the pressing force per unit area. A similar procedure to Example 1 except for these changes was carried out.

Catching and holding force by the electrostatic chuck 110: 50 kgf

Holding force by the pressing portions 120: 200 kgf (Pressing force per unit area: 20 kgf/mm²)

Since the displacement of the glass substrate 200 was less than 0.5 mm, it was determined that no displacement was detected. The number of defects having a size at least 200 nm on the film deposit surface and the rear surface (the central portions and the outer peripheral portions) of the glass substrate 200 was zero.

Comparative Example 1

A similar procedure to Example 1 was carried out except that the catching and holding force applied to the glass substrate 200 by the electrostatic chuck 110, and the holding force applied to the glass substrate by the pressing portions 120 of the mechanical chuck were as follows.

Catching and holding force by the electrostatic chuck 110: 50 kgf

Holding force by the pressing portions 120: 100 kgf (Pressing force per unit area: 1 kgf/mm$^2$)

It was revealed that the glass substrate 200 was displaced by 1 mm before and after the above-mentioned procedure was carried out. Since it was revealed that the glass substrate was displaced, the measurement of the number of defects was not performed.

Comparative Example 2

The catching and holding force applied to the glass substrate 200 by the electrostatic chuck 110, and the holding force applied to the glass substrate by the pressing portions 120 of the mechanical chuck were as follows. The contact areas of the pressing portions 120 in contact with the glass substrate 200 were reduced to modify the pressing force per unit area. A similar procedure to Example 1 except these changes was carried out.

Catching and holding force by the electrostatic chuck 110: 50 kgf

Holding force by the pressing portions 120: 100 kgf (Pressing force per unit area: 30 kgf/mm$^2$)

It was revealed the glass substrate 200 was displaced by 1.5 mm before and after the above-mentioned procedure was carried out. Since it was revealed that the glass substrate was displaced, the measurement of the number of defects was not performed.

Comparative Example 3

A similar procedure to Example 1 was carried out except that the contact areas of the pressing portions 120 in contact with the glass substrate 200 were further reduced to modify the pressing force per unit area.

Catching and holding force by the electrostatic chuck 110: 150 kgf

Holding force by the pressing portions 120: 100 kgf (Pressing force per unit area: 30 kgf/mm$^2$)

Since the displacement of the glass substrate 200 was less than 0.5 mm, it was determined that no displacement was detected. However, the number of defects having a size of at least 200 nm on the outer peripheral portion of the film deposition surface of the glass substrate 200 was 20.

Comparative Example 4

An electrostatic chuck 110 having no convex portion on the outer peripheral portion (where the entire upper surface of the electrostatic chuck served as the catching and holding surface) was used, and a similar procedure to Example 1 was carried out except that the catching and holding force applied to the glass substrate 200 by the electrostatic chuck 110 and the holding force applied to the glass substrate by the pressing portions 120 of the mechanical chuck were as follows.

Catching and holding force by the electrostatic chuck 110: 50 kgf

Holding force by the pressing portions 120: 100 kgf (Pressing force per unit area: 1 kgf/mm$^2$)

It was observed that the glass substrate 200 was displaced by 1.5 mm before and after the above-mentioned procedure. Since the displacement of the glass substrate was observed, the measurement of the number of defects was not performed.

Comparative Example 5

A similar procedure to Comparative Example 4 was carried out except that the contact areas of the pressing portions 120 in contact with the glass substrate 200 were further reduced to modify the pressing force per unit area.

Catching and holding force by the electrostatic chuck 110: 50 kgf

Holding force by the pressing portions 120: 100 kgf (Pressing force per unit area: 30 kgf/mm$^2$)

It was observed that the glass substrate 200 was displaced by 1.5 mm before and after the above-mentioned procedure. Since the displacement of the glass substrate was observed, the measurement of the number of defects was not performed.

Comparative Example 6

A similar procedure to Comparative Example 4 was carried out except that the catching and holding force applied to the glass substrate 200 by the electrostatic chuck 110 and the holding force applied to the glass substrate by the pressing portions 120 of the mechanical chuck were as follows.

Catching and holding force by the electrostatic chuck 110: 150 kgf

Holding force by the pressing portions 120: 100 kgf (Pressing force per unit area: 1 kgf/mm$^2$)

Since the displacement of the glass substrate 200 was less than 0.5 mm, it was determined that no displacement was detected. However, the number of defects having a size of at least 200 nm on the central portion on the rear surface of the glass substrate 200 was 220.

Comparative Example 7

A similar procedure to Comparative Example 5 was carried out except that the contact areas of the pressing portions 120 in contact with the glass substrate 200 were further reduced to modify the pressing force per unit area.

Catching and holding force by the electrostatic chuck 110: 150 kgf

Holding force by the pressing portions 120: 100 kgf (Pressing force per unit area: 30 kgf/mm$^2$)

Since the displacement of the glass substrate 200 was less than 0.5 mm, it was determined that no displacement was detected. However, the number of defects having a size of at least 200 nm on the central portion on the rear surface of the glass substrate 200 was 112 and that the number of defects having a size of at least 200 nm on the outer peripheral portion on the film deposition surface was 11.

Reference Example 1

In this Reference Example, the effect of the positioning operation by the positioning devices 130 was evaluated. Specifically, as in Example 1, in accordance with the procedure shown in FIGS. 4(*a*) to (*e*), the robot arm 300 was used to transfer the glass substrate 200 to a position above the electrostatic chuck 110, and the bottom sides of the glass substrate 200 were brought into contact with the guide surfaces of the positioning devices 130, followed by lowering the glass substrate 200 by gravity to perform the positioning operation such that the positional relationship between the electrostatic chuck 110 and the glass substrate 200 was put in a proper state. After that, the four corners of the rear surface of the glass substrate 200 were held by the supporting pins 140, the supporting pins 140 and the positioning devices 130 (actually the mask 150 with the positioning devices 130 mounted thereto) were lowered to bring the rear surface of the glass substrate 200 into contact with the catching and holding surface (the upper surface of the catching and holding portion 111) of the electrostatic chuck 110. The displacement of the glass substrate 200 caused by this positioning operation was measured in the following procedure.

Method (2) for Measuring the Displacement of the Glass Substrate

As in Example 1, a Mo/Si multilayer reflective film was formed on the film deposition surface of the glass substrate 200 in accordance with the procedure described with respect to the reflective layer of an EUV mask blank while the glass substrate 200 was held by the electrostatic chuck 110 and the mechanical chuck. The catching and holding force applied to the glass substrate 200 by the electrostatic chuck 110, the holding force applied to the glass substrate by the pressing portions 120, and the pressing force per unit area applied by the pressing portions 120 were the same as those in Example 1. At the time of forming the Mo/Si multilayer reflective film, the glass substrate 200 was rotated at 30 rpm along with the glass substrate-holding tool. After formation of the Mo/Si multilayer reflective film, a picture of the film deposition surface of the glass substrate 200 was taken. The presence and absence of displacement was determined by evaluating, by means of image analysis, whether the outer rectangular shape and the rectangular shape of the film deposition area of the glass substrate 200 were in parallel and equal distant in the vertical and horizontal directions in FIG. 1 or not.

The determination revealed that the outer rectangular shape and the rectangular shape of the film deposition area of the glass substrate 200 were in parallel and that the differences in distance in the vertical and horizontal directions in FIG. 1 were less than 0.05 mm, respectively.

Reference Example 2

A similar procedure to Reference Example 1 was carried out by using the glass substrate-holding tool wherein the positioning devices were disposed only at two locations of an upper side and a left side in FIG. 1.

The outer rectangular shape and the rectangular shape of the film deposition area of the glass substrate 200 were in parallel. The differences in distance in the vertical and horizontal directions in FIG. 1 were less than 0.05 mm, respectively.

Reference Example 3

A similar procedure to Reference Example 1 was carried out by using the glass substrate-holding tool wherein each positioning device was configured such that the angle formed by the guide surface and the bottom surface of the glass substrate was 5°.

The outer rectangular shape and the rectangular shape of the film deposition area of the glass substrate 200 were parallel, and the differences in distance in the vertical and horizontal directions in FIG. 1 were less than 0.05 mm, respectively.

Reference Example 4

A similar procedure to Reference Example 1 was carried out by using the glass substrate-holding tool wherein each positioning device was configured such that the angle formed by the guide surface and the bottom surface of the glass substrate was 80°.

The outer rectangular shape and the rectangular shape of the film deposition area of the glass substrate 200 were parallel, and the differences in distance in the vertical and horizontal directions were less than 0.05 mm, respectively.

Reference Example 5

A similar procedure to Reference Example 1 was carried out by using the glass substrate-holding tool wherein the positioning devices were disposed only at two locations on the upper side and the lower side in FIG. 1.

The outer rectangular shape and the rectangular shape of the film deposition area of the glass substrate 200 were parallel. Although the differences in distance in the vertical direction in FIG. 1 was less than 0.05 mm, the difference in distance in the horizontal direction was 0.6 mm.

Reference Example 6

A similar procedure to Reference Example 1 was carried out by using the glass substrate-holding tool wherein only one positioning device was disposed on the upper side in FIG. 1.

The outer rectangular shape and the rectangular shape of the film deposition area of the glass substrate 200 were parallel. Although the difference in distance in the vertical direction in FIG. 1 was less than 0.05 mm, the difference in distance in the horizontal direction was 0.9 mm.

Reference Example 7

A similar procedure to Reference Example 1 was carried out by using the glass substrate-holding tool wherein each positioning device was configured such that the angle formed by the guide surface and the bottom surface of the glass substrate was 3°.

The outer rectangular shape and the rectangular shape of the film deposition area of the glass substrate 200 slightly deviated from being parallel, and the differences in distance in the vertical and horizontal directions in FIG. 1 were at most 0.3 mm, respectively.

Reference Example 8

A similar procedure to Reference Example 1 was carried out by using the glass substrate-holding tool wherein the positioning devices were disposed only at two locations on the upper side and left side in FIG. 1, and the distance between the end of a portion of the glass substrate 200 in contact with the guide surface of each positioning device and the closest end of the glass substrate was 7.6 mm.

The outer rectangular shape and the rectangular shape of the film deposition area of the glass substrate 200 slightly deviated from being parallel, and the differences in distance in the vertical and horizontal directions in FIG. 1 were at most 0.6 mm, respectively.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2011-007760 filed on Jan. 18, 2011 including specification, claims, drawings and summary is incorporated herein by reference in its entirety.

REFERENCE SYMBOLS

100: Glass substrate-holding tool
110: Electrostatic chuck
111: Catching and holding portion
120: Pressing portions
130: Positioning device

140: Supporting pins
150: Mask portion
200: Glass substrate
300: Arm for transporting substrate

What is claimed is:

1. A glass substrate-holding tool which is adapted to be employed during the production of a reflective mask blank for EUV lithography (EUVL), comprising:
    an electrostatic chuck configured to catch and hold a portion of a rear surface of a glass substrate; and
    a mechanical chuck including pressing portions and configured to press portions of a film deposition surface of the glass substrate by the pressing portions so as to clamp and hold the glass substrate from a side of the film deposition surface and a side of the rear surface;
    wherein a caught and held portion of the glass substrate caught and held by the electrostatic chuck, and pressed portions of the glass substrate pressed by the mechanical chuck are located outside a quality-guaranteed region on each of the film deposition surface and the rear surface of the glass substrate;
    wherein the sum of a catching and holding force applied to the glass substrate by the electrostatic chuck and a holding force applied to the glass substrate by the mechanical chuck is at least 200 kgf; and
    wherein a pressing force per unit area applied to the glass substrate by the mechanical chuck is at most 25 kgf/mm$^2$.

2. The glass substrate-holding tool according to claim 1, wherein the angle formed by a pressing surface of each pressing portion and the film deposition surface of the glass substrate is from 5° to 70°.

3. The glass substrate-holding tool according to claim 1, wherein each pressing portion of the mechanical chuck is made of a material having a lower hardness than the glass substrate.

4. The glass substrate-holding tool according to claim 1, wherein the glass substrate has a rectangular planar shape, the pressed portions of the glass substrate pressed by the mechanical chuck are present at least two locations, and at least two pressed portions are present at positions contained in two opposing sides of four sides forming an outer edge of the film deposition surface of the glass substrate or at positions close to the two opposing sides, respectively.

5. The glass substrate-holding tool according to claim 1, wherein the glass substrate has a rectangular planar shape, the substrate-holding tool further comprising positioning devices satisfying the following requirements:
    (1) Each positioning device includes a guide surface or curved guide surface which is inclined to a side surface and a bottom surface of the glass substrate, and the guide surface or curved guide surface is configured to be brought into contact with a side forming the boundary between the side surface and the bottom surface of the glass substrate when placing the glass substrate on the glass substrate-holding tool;
    (2) The positioning devices are disposed at least one location on each of two orthogonal sides of four sides forming the boundary between the side surface and the bottom surface of the glass substrate;
    (3) When the guide surface or curved guide surface of the positioning devices are brought into contact with the side forming the boundary between the side surface and the bottom surface of the glass substrate, the angle formed by the guide surface or guide curved surface and the bottom surface of the glass substrate is from at least 5° to not larger than 90°.

6. The glass substrate-holding tool according to claim 5, wherein each positioning device is disposed at a single location with respect to each of the two orthogonal sides,
    wherein when a side with each positioning device disposed has a length of L (mm), a distance between an edge of a portion of the side in contact with the guide surface or curved guide surface and an edge of the side is at least 0.1 L.

7. The glass substrate-holding tool according to claim 6, wherein each positioning device is made of a material having a lower hardness than the glass substrate.

\* \* \* \* \*